United States Patent
Buehs et al.

(10) Patent No.: US 11,561,246 B2
(45) Date of Patent: Jan. 24, 2023

(54) METHOD AND DEVICE FOR TESTING WHETHER A CURRENT COLLECTOR IS IN CONTACT

(71) Applicant: SIEMENS MOBILITY GMBH, Munich (DE)

(72) Inventors: Florian Buehs, Berlin (DE); Thomas Stark, Woltersdorf (DE); Goeran Saenger, Berlin (DE); Andre Tolksdorf, Berlin (DE)

(73) Assignee: Siemens Mobility GmbH, Munich (DE)

(*) Notice: Subject to any disclaimer, the term of this patent is extended or adjusted under 35 U.S.C. 154(b) by 404 days.

(21) Appl. No.: 16/643,659

(22) PCT Filed: Aug. 22, 2018

(86) PCT No.: PCT/EP2018/072673
§ 371 (c)(1),
(2) Date: Mar. 2, 2020

(87) PCT Pub. No.: WO2019/042843
PCT Pub. Date: Mar. 7, 2019

(65) Prior Publication Data
US 2020/0269701 A1     Aug. 27, 2020

(30) Foreign Application Priority Data
Aug. 30, 2017   (DE) .................. 10 2017 215 135.8

(51) Int. Cl.
*G01R 19/165* (2006.01)
*B60L 5/38* (2006.01)
(Continued)

(52) U.S. Cl.
CPC .............. *G01R 19/165* (2013.01); *B60L 3/00* (2013.01); *B60L 5/18* (2013.01); *B60L 5/24* (2013.01);
(Continued)

(58) Field of Classification Search
CPC ...... B60L 3/00; B60L 3/12; B60L 5/18; B60L 5/19; B60L 5/20; B60L 5/22; B60L 5/24;
(Continued)

(56) References Cited

U.S. PATENT DOCUMENTS 6,523,654 B2    2/2003   Brooks
10,919,395 B2 * 2/2021   Tsutsumi .................. B60L 5/30
(Continued)

FOREIGN PATENT DOCUMENTS

CN          101370684 A     2/2009
CN          101672875 A     3/2010
(Continued)

OTHER PUBLICATIONS

Caiyongjun et al.: "Research on non-contact detection of overvoltage in EHV power network", 2007.
(Continued)

*Primary Examiner* — Zachary L Kuhfuss
*Assistant Examiner* — Cheng Lin
(74) *Attorney, Agent, or Firm* — Laurence A. Greenberg; Werner H. Stemer; Ralph E. Locher

(57) ABSTRACT

A method and a device test whether there is contact between a current collector and a contact wire of an overhead line. The current collector is located on a motor vehicle driven by an electric motor, and the contact wire extends in a direction of travel. The current collector has two contact regions oriented transversely to the direction of travel which are arranged one behind the other in the direction of travel and on each of which an end contact element is located. A pair
(Continued)

of end contact elements located on the same side is connected to a measuring device and an electrical state variable is detected by the measuring device. Subsequently, it is determined in accordance with the detected state variable whether the pair of end contact elements is in contact with the overhead line.

10 Claims, 3 Drawing Sheets

(51) Int. Cl.
    *B60L 15/00* (2006.01)
    *B60L 5/18* (2006.01)
    *B60L 3/00* (2019.01)
    *B60L 5/24* (2006.01)

(52) U.S. Cl.
    CPC ............... *B60L 5/38* (2013.01); *B60L 15/007* (2013.01); *B60L 2200/26* (2013.01)

(58) Field of Classification Search
    CPC ...... B60L 5/26; B60L 5/38; B60L 9/00; B60L 5/42; B60L 15/007; B60L 15/02; B60L 2200/26; B60L 2200/30; G01R 17/00; G01R 17/02; G01R 19/155; G01R 19/165
    See application file for complete search history.

(56) References Cited

U.S. PATENT DOCUMENTS

| | | | |
|---|---|---|---|
| 2010/0060212 A1 | 3/2010 | Negoro et al. | |
| 2011/0030574 A1 | 2/2011 | Kitanaka | |
| 2013/0112519 A1 | 5/2013 | Anders | |
| 2014/0232191 A1* | 8/2014 | Doelling | B61L 27/57 307/42 |
| 2015/0219705 A1* | 8/2015 | Zaki | G01R 31/58 324/503 |

FOREIGN PATENT DOCUMENTS

| | | | | |
|---|---|---|---|---|
| CN | 102053196 A | 5/2011 | | |
| CN | 102565593 A | 7/2012 | | |
| CN | 102590653 A | 7/2012 | | |
| CN | 103308799 A | 9/2013 | | |
| CN | 103338965 A | 10/2013 | | |
| CN | 103842206 A | 6/2014 | | |
| CN | 104540704 A | 4/2015 | | |
| CN | 105244933 A | 1/2016 | | |
| DE | 665110 C | 9/1938 | | |
| DE | 19950513 A1 | 4/2001 | | |
| DE | 19950513 A1 | * 4/2001 | ................ | B60L 3/00 |
| DE | 102005041511 A1 | 3/2007 | | |
| DE | 102014116736 A1 | * 5/2016 | ....... | G01R 19/16528 |
| DE | 102014116736 A1 | 5/2016 | | |
| JP | 2004096877 A | 3/2004 | | |
| JP | 2013183560 A | * 9/2013 | ................ | B60L 3/00 |
| JP | 5833952 B2 | 12/2015 | | |
| RU | 41280 U1 | 10/2004 | | |
| WO | 2012163762 A2 | 12/2012 | | |
| WO | WO-2012163762 A2 | * 12/2012 | .......... | B60L 11/1837 |

OTHER PUBLICATIONS

Komiyama et al: "The motion simulation of catenary pantograph considering 3d structure", Foreign Diesel Locomotive Mar. 31, 2017, pp. 30-33—English abstract.

Aydin et al.: "A New Contactless Fault Diagnosis Approach for Pantograph-Catenary System", Proceedings of 15th International Conference Mechatronika Jan. 21, 2013.

* cited by examiner

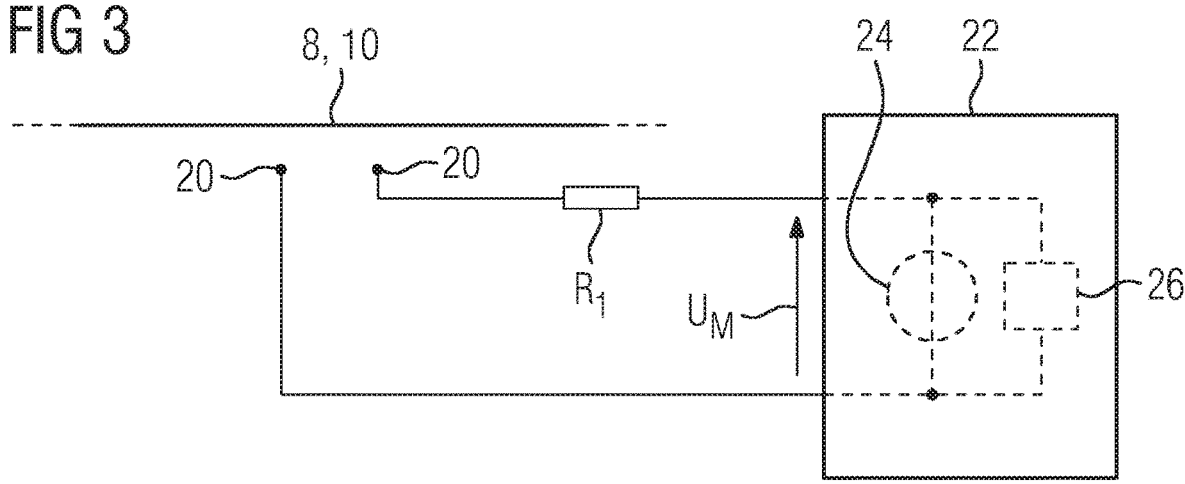
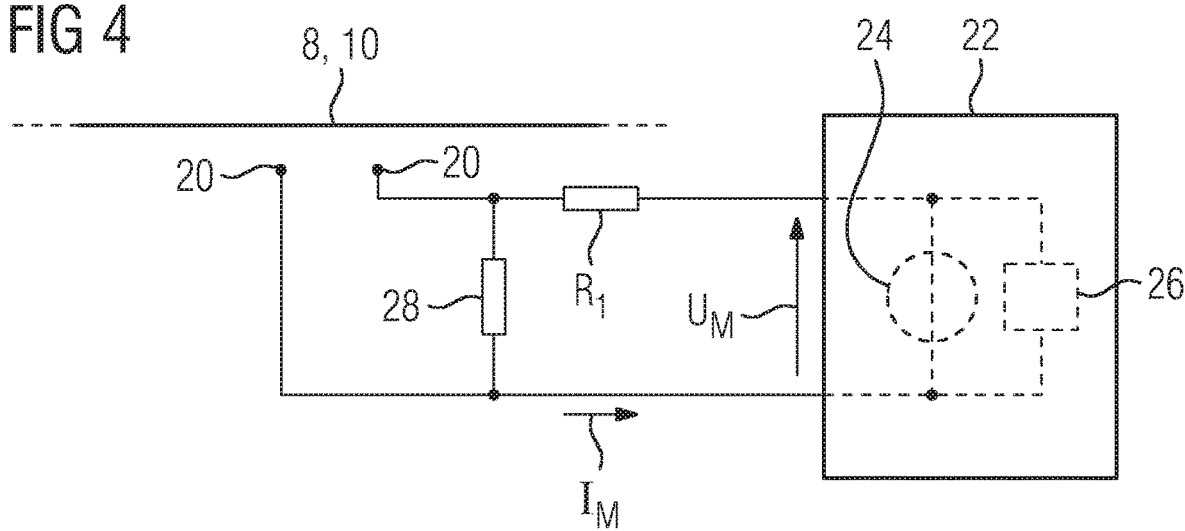

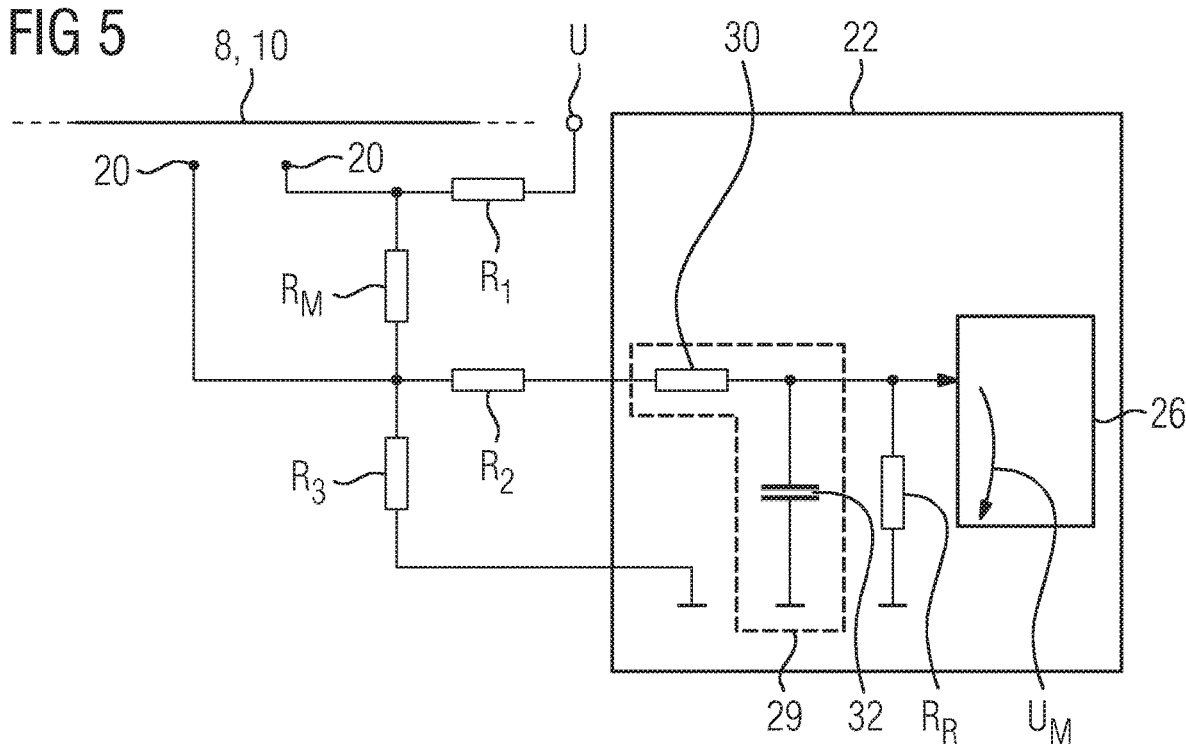

METHOD AND DEVICE FOR TESTING WHETHER A CURRENT COLLECTOR IS IN CONTACT

BACKGROUND OF THE INVENTION

Field of the Invention

The invention relates to a method and a device for testing whether a current collector is in contact with a contact wire extending in a direction of travel of an overhead line.

Nowadays, various types of electrical power supply for motor vehicles driven by an electric motor are used as part of the electrification of the automobile sector. One of these types is, for example, the supply of a motor vehicle by means of an overhead line arranged above a carriageway, as is used in a known manner in rail vehicles. Motor vehicles designed for this purpose, especially trucks, have a current collector for supplying energy which is in contact with the overhead line and thus ensures the power supply.

Contacting the current collector with the overhead line is not only to be ensured from the point of view of energy transmission, functional contacting of the current collector with the overhead line is also important for safety reasons.

If, for example, the motor vehicle travels laterally outside a defined and permissible range, there is a risk that the current collector will no longer be able to remain in functional contact with the overhead line. In other words, the overhead line "slides" down from the current collector. Such sliding down of the overhead line from the current collector may result in damage to the current collector and/or the overhead line, and thus possibly also the vehicle.

SUMMARY OF THE INVENTION

On this basis, the object of the invention is to provide a method and a device by means of which contact is made easily and reliably with an overhead line.

The object based on the method is achieved according to the invention by a method with the features of the independent method claim.

Advantageous embodiments, developments and variants are the subject of the subclaims.

The method is designed for testing whether a current collector is in contact with a contact wire of an overhead line extending in a direction of travel. In the present case, an overhead line is understood to mean in particular an electrical supply line which has the contact wire, which is arranged above a carriageway by means of, for example, a plurality of suspension cables. Typically, the contact wire is acted upon by a (supply) voltage which is "tapped off" by the current collector.

The current collector is located on a motor vehicle driven by an electric motor. In the present case, a motor vehicle driven by an electric motor is understood to mean a (passenger) motor vehicle which has an electric motor as a traction motor, either in the manner of a hybrid motor vehicle (a combination of an internal combustion engine and an electric motor) or in the manner of a motor vehicle driven purely by an electric motor. For the sake of simplicity, the motor vehicle driven by an electric motor is referred to hereinafter as a motor vehicle. Furthermore, the current collector has two contact regions which are oriented transversely to the direction of travel and are arranged spaced from one another in the direction of travel one behind the other. The contact regions are usually designed as wearing strips, such that the overhead line, in particular the contact wire, is in contact with the latter for supplying power. The contact wire thus "grinds" over the contact regions, for example, in a driving mode.

At each end, a contact region has an end contact element. The end contact elements usually have a "downwards" bend counter to a vertical direction and are therefore also referred to as horns due to their (bent) shape. In other words, the shape of the end contact elements preferably describes a section of an arc oriented counter to the vertical direction.

End contact elements arranged on the same end side form a pair and are connected to a measuring device by means of which an electrical state variable is detected. In the present case, the measuring device is understood to mean, for example, a measuring circuit with a current or voltage detection element. In other words, viewed in the direction of travel, for example, the left end contact elements of the contact regions form a left-hand pair of contact elements which is connected to the measuring device. Both the left-hand end contact element pair and the right-hand end contact element pair are preferably each connected to a measuring device or to a common measuring device. In the present case, right and left in the direction of travel are considered. Depending on the detected state variable, it is determined whether the end contact elements are in contact with the overhead line.

This embodiment is based on the consideration that when a maximum permissible lateral offset of the motor vehicle is exceeded with respect to the overhead line, the current collector is likewise no longer positioned within a permissible lateral offset to the overhead line. In the present case, a maximum permissible lateral offset is understood as meaning a maximum parallel displacement of the motor vehicle and thus also of the current collector for the overhead line, so that functional contacting of the current collector with the overhead line is still ensured. Departing from the maximum permissible lateral offset may result in the overhead line "sliding down" from the current collector.

By detecting the contacting of the end contact elements with the overhead line in the event of an "imminent" departure from the maximum permissible lateral offset, such "sliding down" can thus be prevented and suitable countermeasures taken. In order to detect the contact, in the present case a circuit which is formed by the measuring device and the connection to the respective end contact element is closed. I.e., if the motor vehicle, for example, moves laterally to the left of the overhead line (viewed in the direction of travel), the overhead line "migrates" to the right on the current collector (viewed in the direction of travel). As soon as the overhead line reaches the two right-hand end contact elements, it electrically connects them to one another and thus closes the circuit formed by the measuring device and the electrical state variable is detected. In other words, the end contact elements and the contact wire thus function according to the principle of a mechanical switch, in which the switch contacts to be connected to the end contact elements and the contact wire form a switching element.

On the basis of the state variable it is thus determined that the current collector (and thus also the motor vehicle) no longer stops within the maximum permissible lateral offset and there is a risk of the overhead line "sliding down" from the current collector. This is communicated to a driver of the motor vehicle, for example, so that the latter can execute a counter-control movement, for example. Alternatively, a signal is transmitted to a drive control unit which then performs a corrective movement, for example in the form of a steering movement, in order to reposition the motor vehicle within the maximum permissible lateral offset. In the present case, the drive control unit is understood to mean a unit which, for example, is designed in the manner of an active lane departure warning system and thus autonomously controls the motor vehicle. For example, a connection to a motor control unit of a current collector actuating unit is also made possible so that the latter carries out a correction movement of the current collector in order to reposition the current collector within the maximum permissible lateral offset.

The method described also takes place analogously when the motor vehicle departs to the right from the maximum permissible lateral offset.

The advantage of this embodiment is that an impending loss of contact between the current collector and the overhead line is detected and can thus be prevented. In addition, it is possible to detect a contact between the end contact elements and the overhead line without additional and complex sensor units.

The detected electrical state variable is preferably an electrical voltage. In this case, when the end contact elements are contacted with the overhead line by the measuring device, for example, a voltage drop is detected. Alternatively, the detected electrical state variable is the electrical current which, when the end contact elements are in contact with the overhead line, for example, flows through a resistance element and thus detects the contact.

In particular, the end contact elements are designed to be electrically conductive and are also designed to be insulated from the contact regions. In this way, on the one hand, an electrical conductivity of the end contact elements necessary for the method is achieved and, on the other hand, undesired electrical contacting or connection of the end contact elements to the contact regions is prevented by the insulation.

According to a preferred development, the measuring device has its own (current and/or) voltage supply so that the contacting of the end contact elements with the overhead line is detected independently of an electrical state of the overhead line. In the present case, the electrical state of the overhead line is to be understood as meaning whether the overhead line—specifically the contact wire—is supplied with a voltage or, for example, is switched off due to maintenance work.

According to a preferred development, the measuring device has at least one measuring resistance element and one reference resistance element. A voltage drop via the reference resistance element is preferably determined by means of the measuring device. In this case, the voltage drop varies as a function of a contact between the end contact elements and the overhead line. For this purpose, the measuring resistance element and the reference resistance element are preferably connected in series and specifically in the manner of a voltage divider circuit within the measuring device. In this way, a voltage drop and thus contacting of the end contact elements with the overhead line is detected in a simple manner. The two end contact elements, which are connected to the measuring device, are connected in parallel to the measuring resistance element, such that the measuring resistance element is electrically bridged when making contact with the overhead line. An exact function of such a voltage divider circuit will be explained in more detail hereinafter.

Preferably, the voltage drop occurs when the end contact element is not in contact with the contact wire via the measuring resistance element and the reference resistance element. In the present case, not in contact is understood to mean on the one hand that the current collector is not connected to the overhead line at all and, on the other hand, that the current collector is only in contact with the overhead line with the contact regions within the aforementioned maximum permissible lateral offset.

The total voltage, i.e. the voltage drop of the total voltage of the individual supply of the measuring device, is therefore divided between the measuring resistance element and the reference resistance element.

In the present case, an essential aspect is also to be seen in the fact that the voltage drop only takes place via the reference resistance element when the end contact element is in contact with the overhead line. For this purpose, as already mentioned, the measuring resistance element is bridged by the overhead line (also referred to as short-circuited) as a result of the contact with the end contact elements. In other words, when making contact with the overhead line, a partial circuit which is connected in parallel with the measuring resistance element and is formed by the end contact elements is closed. As a result, a connection which is low resistance in comparison with the measuring resistance element, and via which a current flows, is formed parallel to the measuring resistance element.

Viewed in terms of circuitry, the measuring device thus only has the reference resistance element. The voltage of the supply of the measuring device consequently only drops across the reference resistance element. The voltage drop at the reference resistance element thus has a higher value than the voltage drop when the measuring resistance element is not bridged. This relative increase in the voltage drop on the reference resistance element is used to detect contact between the end contact elements and the overhead line.

The voltage drop is evaluated at the reference resistance element, for example, by means of an evaluation unit. The evaluation unit is, for example, integrated into the aforementioned motor control unit of the current collector actuating unit and is connected to the measuring device by means of, for example, a wired or wireless connection. Alternatively, the evaluation unit is arranged inside the motor vehicle.

Expediently, when the end contact elements are in contact with the overhead line, a warning signal is output, for example, to the drive control unit and/or to the driver of the motor vehicle. Alternatively, for example, an actuating signal is output by the evaluation unit to the current collector actuating unit such that the current collector actuating unit corrects a position of the current collector with regard to the overhead line by means of a control movement. For example, the current collector actuating unit separates the current collector from the contact wire.

The object based on the device is achieved according to the invention by a device with the features of the independent device claim.

The device is designed for testing a contact between a current collector which is arranged on a motor vehicle driven by an electric motor and a contact wire of an overhead line and is used in particular for performing the method described above.

The advantages and preferred embodiments listed with regard to the method are to be applied analogously to the device and vice versa.

For the sake of simplicity, the motor vehicle driven by an electric motor is referred to as a motor vehicle hereinafter.

The device has the current collector which can be moved in and counter to a vertical direction and is moved up to the overhead line "from below" to be brought into contact with the overhead line in the vertical direction. The current collector has at least two contact regions oriented transversely to the direction of travel. The contact regions are usually designed as wearing strips and are arranged one behind the other at a distance from one another in the direction of travel. In addition, end contact elements are arranged at the end of the contact regions in each case. Alternatively, the end contact elements are arranged as a separate component on the wearing strip.

The device also has the measuring device for detecting an electrical state variable, for example the electrical voltage. In each case, two end contact elements arranged on the same end side on the contact regions form a pair (also referred to as a pair of end contact elements) and are preferably connected to the measuring device. The end contact elements arranged to the left of the overhead line are connected to the measuring device. Similarly, the end contact elements arranged to the right of the overhead line are connected to the measuring device. Analogously, both pairs of end contact elements (left and right) are each connected to a measuring device. In addition, the measuring device is designed in such a way that, depending on the detected state variable, a determination is made as to whether the end contact elements are in contact with the overhead line.

The detection of the contacting of the end contact elements by means of the device is based on the idea that a current path within the measuring device is short-circuited by the current path and thus, for example, an altered voltage drop within the measuring device can be detected.

The advantage of this embodiment is that an "impending" loss of contact between the current collector and the contact wire can be detected at an early stage and can thus be avoided. For example, this means that the motor vehicle, and thus also the current collector, do not exceed a maximum permissible lateral offset during operation.

According to a preferred embodiment, the measuring device has a measuring resistance element and a reference resistance element such that a voltage drop can be detected via the reference resistance element as a function of contacting the end contact elements with the contact wire. For this purpose, the measuring resistance element and the reference resistance element are preferably connected in series in the manner of a voltage divider circuit. The end contact elements are connected in parallel to the measuring resistance element such that the measuring resistance can be electrically bridged via the end contact elements connected in parallel by contacting the end contact elements with the overhead line. Such contacting of the end contact elements thus results in a change in the voltage drop on the reference resistance element as the entire power supply voltage of the measuring device on the reference resistance element drops due to the bridging.

When the end contact elements are not contacted, the power supply voltage of the measuring device decreases, for example, on the measuring resistance element and on the reference resistance element, as a result of which the value of the relative voltage drop on the reference resistance element is reduced compared to the relative voltage drop in the case of contacting (end contact elements are in contact with the overhead line and bridge the measuring resistance element).

The advantage of this embodiment can be seen in the simple and low-cost detection of the contacting of the end contact elements with the contact wire. It is possible to dispense with complex and costly sensor elements.

The end contact elements are expediently designed to be electrically conductive and, in addition, are designed to be electrically insulated from the contact regions. As a result, in particular an electrical separation of end contact elements and contact regions is achieved.

Preferably, the measuring resistance element and the reference resistance element are each designed as an ohmic resistor. In addition, a value of the measuring resistance element has an application-specific predetermined ratio to a value of the reference resistance element.

The advantage of ohmic resistors is that the resistance elements (measuring resistance element and reference resistance element) can be implemented in a simple manner and can also be dimensioned in a simple manner. As a result, the device can be customized. In this case, can be customized is specifically understood to mean that the device, and in particular the resistance elements of the measuring device, can be dimensioned in an application-specific manner.

According to an expedient development, the device has a number of resistance elements, for example, ohmic resistors for current limitation in the event of a fault, for example, an undesired short circuit. This prevents the formation of fault currents occurring in the event of a fault. Such fault currents occur, for example, between the vehicle chassis and a person touching the vehicle chassis.

According to a preferred embodiment, the measuring device is integrated within a control unit of the current collector, for example, of the motor control unit of a current collector actuating unit. As a result, for example, a short line length between the end contact elements and the measuring device is ensured.

Alternatively, or additionally, the measuring device has an evaluation unit by means of which the change in voltage is used to determine whether the end contact elements are in contact with the contact wire. Furthermore, in the event of such contact, the evaluation unit, for example, outputs a warning signal to a driver of the motor vehicle.

Alternatively, or in addition, the evaluation unit, for example, outputs an actuating signal to the current collector actuating unit which, for example, is designed in such a way that it executes a correction movement of the current collector as a function of the actuating signal.

The motor vehicle is preferably designed as a truck driven by an electric motor or a bus driven by an electric motor.

Exemplary embodiments of the invention are explained in more detail hereinafter with reference to the figures. In part in greatly simplified representations, the figures show:

DETAILED DESCRIPTION OF THE INVENTION

Figure 1:
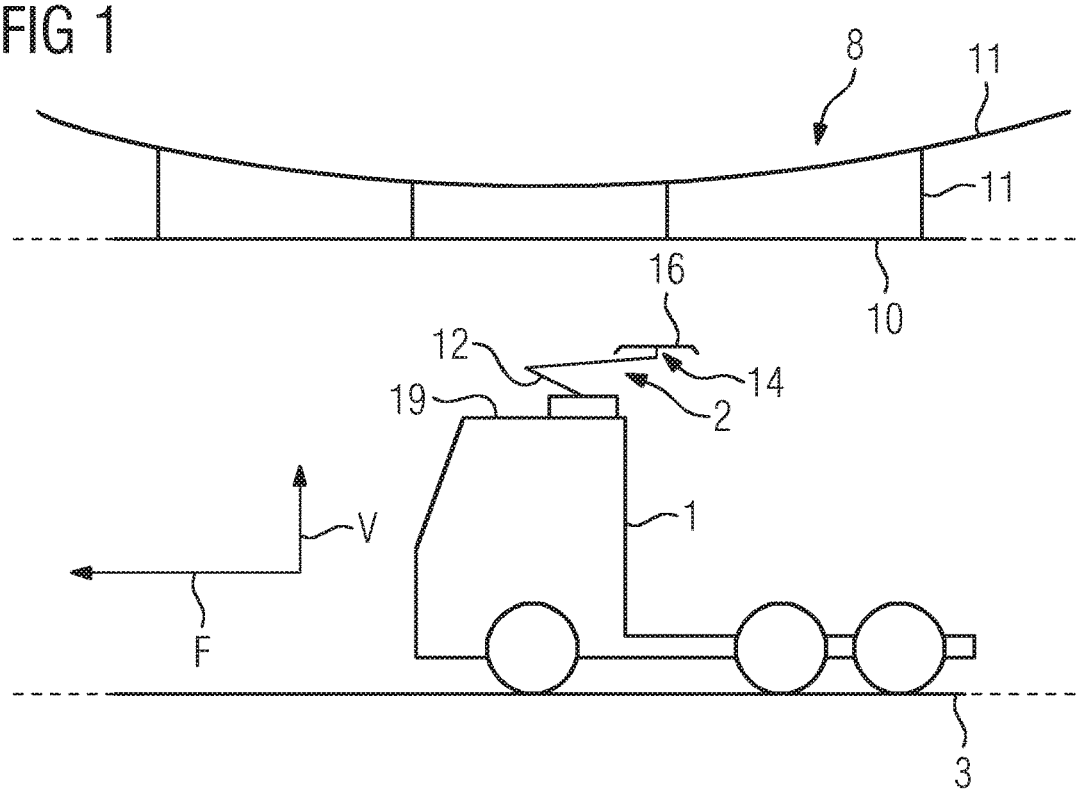
FIG. 1 A roughly sketched representation of a motor vehicle driven by an electric motor, FIG. 2 A perspective partial view of a current collector, FIG. 3 A roughly sketched circuit diagram of a measuring device according to a first embodiment variant, FIG. 4 A roughly sketched circuit diagram of the measuring device according to a second embodiment variant and FIG. 5 A roughly sketched circuit diagram of the measuring device according to a third embodiment variant.

In the figures, parts having the same effect are represented by the same reference characters.

FIG. 1 shows a roughly sketched illustration of a motor vehicle 1 driven by an electric motor. In the exemplary embodiment, the motor vehicle 1 is designed as a truck driven by an electric motor.

For the electrical supply of the motor vehicle, an overhead line 8 extending in a direction of travel F is arranged above a carriageway 3. The overhead line 8 usually comprises a contact wire 10 and a plurality of support cables 11 on which the contact wire is located. The contact wire 10 is supplied with an electrical voltage.

In order to be able to tap this voltage, the motor vehicle 1 has a current collector 2. The current collector 2 can be moved in and counter to a vertical direction V and has a current collector arm 12. A holding element 14 having two contact regions 16 is arranged on the current collector arm 12. The contact regions 16 are usually designed as wearing strips 18 (shown in FIG. 2).

In order to keep the distance of the current collector 2 from the contact wire 10 as short as possible, the current collector 2 in the exemplary embodiment is arranged on the roof 19 of the motor vehicle 1.

Figure 2:
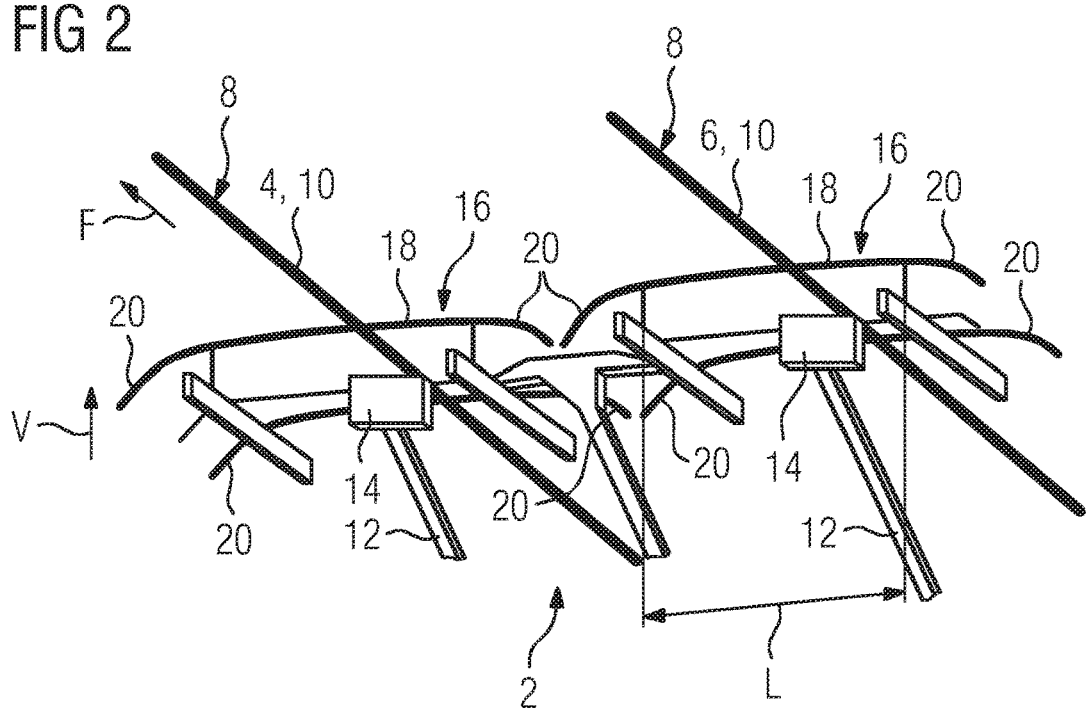

The current collector 2, which is at least partially illustrated in FIG. 2, is designed in the exemplary embodiment specifically as a double structure. I.e. so that both an electrical phase line 4 which is supplied with an electrical power supply voltage and an electrical ground line 6 which corresponds to an electrical zero potential are designed as an overhead line 8 and, in particular, as a contact wire 10, each of which can be contacted by means of a current collector 2. The contact wire 10 extends in a direction of travel. The background to this embodiment is a missing earth connection in the form of a rail, as is customary in rail vehicles.

On account of the redundant and identical construction, with regard to the current collector 2, only the current collector 2 in contact with the phase line 4 will be discussed below. However, all the listed components, elements and/or properties apply analogously to the current collector 2 which is in contact with the ground line 6.

As already shown in FIG. 1, the current collector 2 has a current collector arm 12. A holding element 14, also referred to as a rocker, is arranged on the current collector arm 12. In the exemplary embodiment, the holding element 14 has two contact regions 16, each with a wearing strip 18. The wearing strips 18 serve to make direct contact with the contact wire 10 so that in driving mode, for example, the wearing strips 18 grind along the contact wire 10 and thus ensure the electrical supply of the motor vehicle.

End contact elements 20 are arranged at both ends of the wearing strips 18. In the exemplary embodiment, the end contact elements 20 have a bent shape counter to the vertical direction V (i.e. downwards) and are therefore also referred to as horns. The end contact elements 20 prevent the contact wire 10 from "slipping" under the contact region 16.

Furthermore, the end contact elements 20 limit a maximum permissible lateral offset L. In the present case, the maximum permissible lateral offset L is understood to mean a deflection of the current collector 2 and in particular, the wearing strips 18, parallel to the contact wire 10 so that a functional contact with the contact wire 10 is ensured. At the same time, a maximum permissible lateral offset of the motor vehicle is predefined hereby.

In order to prevent the maximum permissible lateral offset L being exceeded, the current collector 2 has a measuring device.

FIG. 3 shows such a measuring device 22 according to a first embodiment variant. In this case, in the exemplary embodiment two end contact elements 20 form a pair of end contact elements which is electrically connected to the measuring device 22, for example in a wired manner by means of an electrical line. For this purpose, the electrical line is arranged on, for example, screwed to the end contact elements. In other words, in particular end contact elements 20 on the same end side are connected to the measuring device 22. That is to say, for example (viewed in the direction of travel F and the contact wire 10 arranged centrally on the wearing strips 18), either the two left-hand end contact elements 20 or the two right-hand end contact elements 20 are connected to the measuring device 22. Preferably, both the left-hand end contact elements 20 and the right-hand end contact elements 20 are connected to the measuring device 22 or, in each case, to a measuring device 22. In the exemplary embodiment, the connection of the two left-hand end contact elements 20 to the measuring device 22 is shown diagrammatically by way of example.

In order to form an electrical conductivity, the end contact elements 20 have at least one electrically conductive, for example, metallized surface. Alternatively, the end contact elements 20 are made from a metal.

Within the measuring device 22, the end contact elements 20 are connected to a voltage source 24 which generates a measurement voltage $U_M$. If the motor vehicle and/or the current collector 2 now moves to the right (viewed in the direction of travel F), the contact wire 10 "approaches" the left-hand end contact elements 20. If the motor vehicle and/or the current collector 2 now moves so far to the right that the left-hand end contact elements 20 grind on the contact wire 10, the contact wire 10 short-circuits the two end contact elements 20 and thus closes a circuit which is formed by the voltage source 24 within the measuring device 22. Consequently, a current flows through the measuring device 22 which is detected in the measuring device 22. Alternatively, resistance is detected. In addition, the measuring device 22 has a current limiting element $R_1$, for example, an ohmic resistor for current limitation.

The method described is carried out analogously for a deflection of the motor vehicle and/or the current collector to the left, viewed in the direction of travel.

An event in which the end contact elements 20 are in contact with the contact wire 10 is subsequently generated as a function of the flowing current, for example, by an evaluation unit 26 connected to the measuring device 22 and, for example, transmitted in the form of a warning signal to a driver of the motor vehicle and/or in the form of an actuating signal to a motor control unit of a current collector actuating unit. The current collector actuating unit then, for example, corrects the position using a method of the current collector 2. Alternatively, the warning signal is transmitted to a drive control unit of the motor vehicle 1 which, for example, performs a steering movement for "repositioning" of the motor vehicle into the maximum permissible lateral offset.

FIG. 4 shows a roughly sketched circuit diagram of the measuring device 22 according to a second embodiment variant.

In addition to the circuit according to FIG. 3, besides the voltage source 24 and the evaluation unit 26, the measuring device 22 has a resistance element 28, for example, an ohmic resistor. In the exemplary embodiment, the resistance element 28 is connected in parallel to the end contact elements 20. According to the second embodiment variant, a current $I_M$ flows within the circuit of the measuring device 22, the value of which is determined, for example, by the value of the resistance element 28. When the end contact elements 20 are in contact with the contact wire 10, the resistance element 28 is electrically bridged in the circuit. This bridging is based on the fact that the end contact elements 20 short-circuited by means of the contact wire 10 form a current path running parallel to the resistance element 28. However, this parallel current path has a resistance with a lower value than the current path in which the resistance element is arranged. Thus, the current of the circuit preferably flows across the end contact elements 20 and the total current of the circuit increases. This increase is detected by the measuring device 22 and the evaluation unit 26 then determines the output of the warning signal and/or the actuating signal according to the first embodiment.

In addition, the measuring device 22 according to the second embodiment variant has a current limiting element $R_1$, for example, an ohmic resistor for current limitation.

FIG. 5 shows a roughly sketched circuit diagram of the measuring device 22 according to a third and particularly preferred embodiment variant.

The measuring device 22 according to FIG. 4 has a measuring resistance element $R_M$ and a reference resistance element $R_R$. The two resistance elements $R_M$, $R_R$ are, for example, designed as ohmic resistors. The measuring resistance element $R_M$ has, for example, a value in the range between 50 kΩ and 70 kΩ. The reference resistance element $R_R$ has, for example, a value of 10 kΩ to 20 kΩ.

The resistance elements are connected to a supply voltage U and are connected to the measuring device 22 in the manner of a voltage divider circuit. I.e. the measuring resistance element $R_M$ is connected in parallel to the end contact elements 20 in a manner analogous to the resistance element 28 according to FIG. 3. The reference resistance element $R_R$ is connected in series to the measuring resistance element $R_M$. A measurement voltage $U_M$ used to determine whether the end contact elements 20 are in contact with the contact wire 10 is tapped in parallel with the reference resistance element $R_R$. The power supply voltage U has, for example, a value in the range between 6V and 30V.

If the end contact elements 20 are not in contact with the contact wire 10, the supply voltage U drops at the two resistance elements $R_M$, $R_R$ connected in series. The measurement voltage $U_M$ is obtained according to the voltage divider rule from the difference between the supply voltage U and the value of the voltage drop across the measuring resistance element $R_M$.

If, for example, as already described above, the motor vehicle is displaced laterally with respect to the contact wire 10 in such a way that the end contact elements 20 grind on the contact wire 10, then the contact wire short-circuits the measuring resistance element $R_M$ and the voltage drop of the supply voltage U takes place solely on the reference resistance element $R_R$. In other words, the measurement voltage $U_M$ corresponds to the supply voltage U. Any additional voltage drops due to, for example, production-related tolerances and/or additional components have been deliberately ignored.

The measuring device 22 according to FIG. 4 also has three current limiting elements $R_1$, $R_2$, $R_3$. For example, the current limiting elements $R_1$, $R_2$, $R_3$ are designed as ohmic resistors. Furthermore, the measuring device 22 according to the third embodiment variant has a filter element 29, for example, for smoothing voltage peaks. For this purpose, the filter element 29 has a filter resistance element 30, for example, an ohmic resistor and a smoothing capacitor 32. The filter elements 30, 32 are arranged, in particular connected, in the manner of a low-pass filter in the measuring device 22.

The invention claimed is:

1. A method for testing whether there is contact between a current collector and a contact wire of an overhead line, the current collector being disposed on a motor vehicle driven by an electric motor and the contact wire extending in a direction of travel, the current collector having two contact regions oriented transversely to the direction of travel and are disposed one behind another in the direction of travel and on each of the contact regions an end contact is disposed, a pair of end contacts disposed on a same end side is connected to a measuring device, wherein the measuring device having at least one measuring resistance and one reference resistance, which comprises the steps of:

detecting an electrical state variable by means of the measuring device by determining a voltage drop via the at least one reference resistance via the measuring device, wherein the voltage drop varies depending on the contact between the end contacts and the overhead line, wherein when the at least one measuring resistance is bridged, the voltage drop only takes place via the reference resistance when the end contacts are in contact with the overhead line; and determining in accordance with a detected electrical state variable whether the pair of end contacts is in contact with the overhead line.

2. The method according to claim 1, wherein the measuring device has a voltage source and is supplied with a power supply voltage by the voltage source.

3. The method according to claim 1, wherein the voltage drop takes place via the measuring resistance and the reference resistance when the contact regions are in contact with the overhead line.

4. The method according to claim 1, which further comprises outputting a warning signal when the pair of end contacts is in contact with the overhead line.

5. A device for testing whether there is contact between a current collector disposed on a motor vehicle driven by an electric motor and a contact wire of an overhead line extending in a direction of travel, the device comprising:

the current collector having two contact regions oriented transversely to the direction of travel and disposed one behind another in the direction of travel and on each of said contact regions an end contact is disposed at both ends of said contact regions; and a measuring device having a measuring resistance and a reference resistance, a pair of end contacts disposed on a same end side is connected to said measuring device and an electrical state variable being detected by means of said measuring device by determining a voltage drop via said reference resistance via said measuring device, wherein the voltage drop varies depending on the contact between the end contacts and the overhead line, wherein when said measuring resistance is bridged, the voltage drop only takes place via said reference resistance when the end contacts are in contact with the overhead line, said measuring device configured such that depending on a detected electrical state variable, it is determined whether said pair of end contacts is in contact with the overhead line.

6. The device according to claim 5, wherein said end contact is electroconductive and is isolated from said contact regions.

7. The device according to claim 5, wherein said measuring resistance and said reference resistance are ohmic resistors.

8. The device according to claim 5, further comprising a number of resistances for current limitation.

9. The device according to claim 5, wherein:
    said current collector has a controller; and
    said measuring device is integrated within said controller of said current collector.

10. The device according to claim 5, wherein the motor vehicle driven by the electric motor is configured as a truck driven by the electric motor.

\* \* \* \* \*